United States Patent
Lafort et al.

(10) Patent No.: US 12,356,862 B2
(45) Date of Patent: *Jul. 8, 2025

(54) DEVICE CONSISTING OF AN ELASTOMER MATRIX, COMPRISING PIEZOELECTRIC CHARGES AND ELECTRODES

(71) Applicant: COMPAGNIE GENERALE DES ETABLISSEMENTS MICHELIN, Clermont-Ferrand (FR)

(72) Inventors: Francois Lafort, Clermont-Ferrand (FR); Xavier Lebrun, Clermont-Ferrand (FR); Guillaume Pibre, Clermont-Ferrand (FR)

(73) Assignee: COMPAGNIE GENERALE DES ETABLISSEMENTS MICHELIN, Clermont-Ferrand (FR)

( * ) Notice: Subject to any disclaimer, the term of this patent is extended or adjusted under 35 U.S.C. 154(b) by 398 days.

This patent is subject to a terminal disclaimer.

(21) Appl. No.: 17/251,628

(22) PCT Filed: Jun. 21, 2019

(86) PCT No.: PCT/FR2019/051514
§ 371 (c)(1),
(2) Date: Dec. 11, 2020

(87) PCT Pub. No.: WO2019/243750
PCT Pub. Date: Dec. 26, 2019

(65) Prior Publication Data
US 2021/0257538 A1    Aug. 19, 2021

(30) Foreign Application Priority Data

Jun. 21, 2018 (FR) ..................... 1855535

(51) Int. Cl.
*H10N 30/85* (2023.01)
*B60C 19/00* (2006.01)
(Continued)

(52) U.S. Cl.
CPC ............. *H10N 30/852* (2023.02); *C08K 3/04* (2013.01); *C08K 3/22* (2013.01); *H02N 2/186* (2013.01);
(Continued)

(58) Field of Classification Search
CPC .... C08K 2003/2237; C08K 2003/2206; C08K 3/22; C08K 3/04; B60C 2019/004;
(Continued)

(56) References Cited

U.S. PATENT DOCUMENTS 4,786,837 A * 11/1988 Kalnin ................. B06B 1/0688
310/365
7,365,119 B2 * 4/2008 Nishioka ............... B60C 1/0016
524/436

(Continued)

FOREIGN PATENT DOCUMENTS

| CN | 107128132 A | 9/2017 |
| CN | 107924986 A | 4/2018 |

(Continued)

OTHER PUBLICATIONS

J. Capsal, et al., "Nanotexture influence of BaTiO3 particles on piezoelectric behaviour of PA 11/BaTiO3 nanocomposites", J. Non-Crystalline Solids 356 (2010) 629-634.
(Continued)

*Primary Examiner* — J. San Martin
(74) *Attorney, Agent, or Firm* — VENABLE LLP

(57) ABSTRACT

A piezoelectric device comprises at least one piezoelectric composite layer P inserted between two conductive composite layers E, each layer E forming an electrode, charac-
(Continued)

terized in that: the layer P is a rubber composition containing more than 50 parts by weight per hundred parts by weight rubber, phr, of diene elastomer, a cross-linking system and at least 5 vol. %, in relation to the total volume of the rubber composition, of piezoelectric inorganic charges; and each layer E is a rubber composition containing at least 50 phr of diene elastomer, a cross-linking system, and conductive charges. A method for producing the device and a tire comprising the device are also disclosed.

17 Claims, 2 Drawing Sheets

(51) Int. Cl.
| | |
|---|---|
| *C08K 3/04* | (2006.01) |
| *C08K 3/22* | (2006.01) |
| *H02N 2/00* | (2006.01) |
| *H02N 2/18* | (2006.01) |
| *H10N 30/045* | (2023.01) |
| *H10N 30/092* | (2023.01) |
| *H10N 30/87* | (2023.01) |

(52) U.S. Cl.
CPC .............. *H02N 2/22* (2013.01); *H10N 30/045* (2023.02); *H10N 30/092* (2023.02); *H10N 30/878* (2023.02); *B60C 19/00* (2013.01); *B60C 2019/004* (2013.01); *C08K 2003/2206* (2013.01); *C08K 2003/2237* (2013.01)

(58) Field of Classification Search
CPC ...... H02N 2/22; H10N 30/852; H10N 30/092; H10N 30/878
See application file for complete search history.

(56) References Cited

U.S. PATENT DOCUMENTS

| | | | |
|---|---|---|---|
| 10,406,866 B2 | 9/2019 | Besnoin et al. | |
| 2002/0112799 A1 | 8/2002 | Hiruma et al. | |
| 2004/0211250 A1 | 10/2004 | Adamsom et al. | |
| 2005/0274176 A1 | 12/2005 | Thiesen et al. | |
| 2007/0240502 A1 | 10/2007 | Morinaga et al. | |
| 2008/0302177 A1 | 12/2008 | Sinnett et al. | |
| 2010/0147061 A1 | 6/2010 | Weston | |
| 2013/0256581 A1 | 10/2013 | Miyoshi et al. | |
| 2017/0246915 A1 | 8/2017 | Besnoin et al. | |
| 2019/0334078 A1 | 10/2019 | Araujo Da Silva et al. | |
| 2021/0245553 A1* | 8/2021 | Lafort | B60C 11/246 |
| 2023/0049031 A1* | 2/2023 | Pibre | H10N 30/857 |

FOREIGN PATENT DOCUMENTS

| | | |
|---|---|---|
| DE | 112016000917 T5 | 11/2017 |
| EP | 1605528 A2 | 12/2005 |
| FR | 3060857 A1 | 6/2018 |
| JP | 10-324120 A | 12/1998 |
| JP | 2005-265446 A | 9/2005 |
| JP | 2005-280511 A | 10/2005 |
| JP | 2008-120950 A | 5/2008 |
| JP | 2013-225608 A | 10/2013 |
| JP | 2014-234038 A | 12/2014 |
| WO | 2008/036088 A1 | 3/2008 |
| WO | 2013/008781 A1 | 1/2013 |

OTHER PUBLICATIONS

T. Furukawa, et al., "Electromechanical Properties in the Composites of Epoxy Resin and PZT Ceramics", Jap. J. Appl. Phys., vol. 15, No. 11, pp. 2119-2129 (1976).

X. Liu, et al., "Piezoelectric and dielectric properties of PZT/PVC and graphite doped with PZT/PVC composites", Materials Sci. and Engineering B 127 (2006) 261-266.

G. Rujijanagul, et al., "Effect of the particle size of PZT on the microstructure and the piezoelectric properties of 0-3 PZT/polymer composites", J. Mater. Sci. Letts. 20, 2001, 1943-1945.

K.A. Hanner, et al., "Thin film 0-3 polymer/piezoelectric ceramic composites: Piezoelectric paints", Ferroelectrics, 100:1, 255-260 (2011).

International Search Report dated Sep. 18, 2019, in corresponding PCT/FR2019/051514 (4 pages).

* cited by examiner

DEVICE CONSISTING OF AN ELASTOMER MATRIX, COMPRISING PIEZOELECTRIC CHARGES AND ELECTRODES

The present invention relates to a device comprising a piezoelectric composite and conductive composites acting as electrodes, each of these composites being based on an elastomeric matrix.

Piezoelectricity develops in materials such as crystals, certain semi-crystalline polymers and piezoelectric ceramics. This physical phenomenon corresponds to the appearance of an electrical polarization induced by an external mechanical deformation. It is an electromechanical coupling where the polarization is proportional to the mechanical stress applied up to a certain level. The piezoelectric effect is then said to be direct. This phenomenon is reversible: when the material is subjected to an external electric field, it is deformed. This is the inverse piezoelectric effect.

A variation in the macroscopic polarization when applying a stress to the sample characterizes the piezoelectric effect. In a system of orthogonal axes, the polarization and the stress are linked in matrix notation by a 2nd rank tensor referred to as piezoelectric tensor dij with i=1, 2, 3 and j=1, 2, 3, 4, 5, 6, respectively corresponding to the axis of polarization and of application of the stress, as shown in FIG. 3.

A piezoactive or piezoelectric composite comprises at least one piezoelectric material, which gives the composite its piezoelectric activity, and one or more non-piezoelectric phases. This combination results in a material having enhanced performance qualities in comparison with each phase alone. The non-piezoelectric phase is generally an organic polymer matrix, in particular a rigid thermoplastic or thermosetting polymer matrix (US 2015134061, WO 2016/157092), which can be of polyamide type (Capsal et al., *Journal of Non-Crystalline Solids*, 2010, 356, 629-634), polyepoxy type (Furukawa et al., *Jpn. J. Appl. Phys.*, 1976, 15, 2119), polystyrene or polyurethane type (Hanner et al., *Ferroelectrics*, 1989, 100, 255-260), PVC type (Liu et al., *Materials Science and Engineering*, 2006, 127, 261-266) or else polyethylene type (Rujijanagul et al., *Journal of Materials Science Letters*, 2001, 20, 1943-1945), or a polymeric matrix comprising cyanoethylated polyvinyl alcohol (EP 2 654 094). The non-piezoelectric phase can also comprise an elastomer or a thermoplastic elastomer, adhered to the piezoelectric phase by rolling (DE 11 2016 000 917 T5). Thus, a piezoelectric composite makes it possible to maximize the electroactivity of the polymer matrix, but generally this combination also restricts its range of deformation.

In the field of tyres, devices which include piezoelectric composites are used as an apparatus for producing energy within a tyre. These devices make it possible to replace conventional limited-life batteries. In particular, the piezoelectric material can be embedded in an epoxy matrix (WO 03/095244 Michelin) or else in a piezoelectric, plastic or thermoplastic polymer matrix (US 2011/0074564) or in an elastomeric matrix (JP 2013/225608).

It would be advantageous to be able to incorporate a piezoelectric device in a tyre in order to monitor the state of wear of this tyre, to detect and locate the impacts experienced by the tyre, such as a pavement impact on the sidewalls or pothole impacts at the crown. The invention is targeted at providing a device which simultaneously exhibits piezoelectric properties but also mechanical properties compatible with its incorporation in a tyre, in particular of resistance to deformation and to elongation.

The invention is targeted at providing a device which can either be adhered, for example adhesively bonded, to the precured tyre or incorporated in the tyre before curing of the latter and thus co-crosslinked with the other elastomers present.

A subject-matter of the present invention is a device comprising at least one piezoelectric composite layer P inserted between two conductive composite layers E, each layer E forming an electrode, characterized in that:
the layer P is a rubber composition based:
on more than 50 parts by weight, per hundred parts by weight of elastomer, phr, of diene elastomer,
on a crosslinking system,
on at least 5% by volume, with respect to the total volume of the rubber composition, of piezoelectric inorganic fillers;
each layer E is a rubber composition based:
on at least 50 phr of diene elastomer,
on a crosslinking system,
on conductive fillers;
the diene elastomer of the layer P being co-crosslinked with the diene elastomer of each layer E.

The device according to the invention thus comprises a piezoelectric composite with its two electrodes. Each electrode is also a composite.

An elastomeric matrix device according to the invention exhibits specific electroactive and mechanical properties. Its formulation makes it possible to confer flexibility and elasticity on the device while retaining a piezoelectric character sufficient for its application as electronic device, in particular as electronic device in a tyre.

The specific electromechanical properties of the device according to the invention, such as its flexibility, its elasticity and its generation of electric charges, exhibit major advantages in comparison with the devices comprising electroactive composites in a thermosetting or thermoplastic matrix.

The elasticity makes possible different operating points which are impossible with thermosetting or thermoplastic matrices which are brittle or which exhibit a plastic deformation.

The generation of electric charges with identical polarization is greater with a lower stress.

According to the invention, the diene elastomer of the layer P is co-crosslinked with the diene elastomer of each layer E. Thus, the different layers are advantageously bonded together covalently, which makes it possible to improve the cohesion of the co-crosslinked layers.

In the layer P, the content of piezoelectric inorganic fillers advantageously varies from 5% to 80% by volume, with respect to the total volume of elastomer matrix, more advantageously from 5% to 60%, more advantageously still from 5% to 50%.

In the layer P, the size of the piezoelectric inorganic fillers advantageously varies from 50 nm to 500 μm.

The piezoelectric inorganic fillers are advantageously piezoelectric ceramics, more advantageously ferroelectric oxides, advantageously having a perovskite structure. In particular, the piezoelectric inorganic fillers are selected from the group comprising barium titanate, lead titanate, lead zirconate titanate (PZT), lead niobate, lithium niobate and potassium niobate fillers; advantageously, the piezoelectric inorganic fillers are barium titanate fillers.

The rubber composition of the layer P advantageously comprises from 75 phr to 100 phr, more advantageously from 90 phr to 100 phr, of diene elastomer.

The crosslinking system of the rubber composition of the layer P and/or of one or each rubber composition of the layer E is advantageously selected from the group consisting of peroxides and their mixtures, in particular organic peroxides. The organic peroxide is advantageously selected from the group consisting of dialkyl peroxides, monoperoxycarbonates, diacyl peroxides, peroxyketals, peroxyesters and their mixtures.

In one or in each layer E, the content of conductive fillers advantageously varies from 10% to 40% by volume, with respect to the total volume of elastomer matrix, more advantageously from 15% to 30%.

The conductive fillers are advantageously graphitized or partially graphitized carbon black.

Another subject-matter of the invention is a process for the preparation of a polarized device according to the invention, comprising a stage of polarization at a polarization temperature lower by at least 5° C. than the lowest Curie temperature, Tc, of the piezoelectric inorganic fillers.

Another subject-matter of the invention is a process for the preparation of a device according to the invention, comprising the following stages:
 (a1) placing at least one piezoelectric composite layer P between two identical or different conductive composite layers E, in order to obtain an assembly;
 (a2) applying a pressure to the assembly obtained following stage (a1);
 (a3) crosslinking the assembly in order to obtain said device.

The process advantageously comprises a stage of polarization (a4) of the device obtained following stage (a3), advantageously at a polarization temperature lower by at least 5° C. than the lowest Curie temperature, Tc, of the piezoelectric inorganic fillers.

The piezoelectric composite layer can be prepared by a process comprising the following stages:
 (b1) incorporating a piezoelectric inorganic filler in a diene elastomer, in a mixer, everything being thermomechanically kneaded, in one or more goes, until a maximum temperature of between 80° C. and 190° C. is reached;
 (b2) cooling the combined mixture to a temperature of less than 80° C.;
 (b3) subsequently incorporating a crosslinking system;
 (b4) kneading everything up to a maximum temperature of less than 80° C.;
 (b5) calendering or extruding the rubber composition thus obtained in the form of a strip.

Each conductive composite layer E can be prepared by a process comprising the following stages:
 (c1) incorporating a conductive filler in a diene elastomer, in a mixer, everything being thermomechanically kneaded, in one or more goes, until a maximum temperature of between 110° C. and 190° C. is reached;
 (c2) cooling the combined mixture to a temperature of less than 100° C.;
 (c3) subsequently incorporating a crosslinking system;
 (c4) kneading everything up to a maximum temperature of less than 110° C.;
 (c5) calendering or extruding the rubber composition thus obtained in the form of a strip.

Another subject-matter of the invention is a tyre comprising a device according to the invention.

Another subject-matter of the invention is the use of the device according to the invention in combination with a sensor.

DESCRIPTION OF THE FIGURES

Other characteristics and advantages of the invention will become more apparent from the description which follows, which is purely illustrative and non-limiting, and should be read with reference to the appended figures, in which.

MEASUREMENTS AND TESTS USED

Manufacture of the Test Specimens

Figure 1:
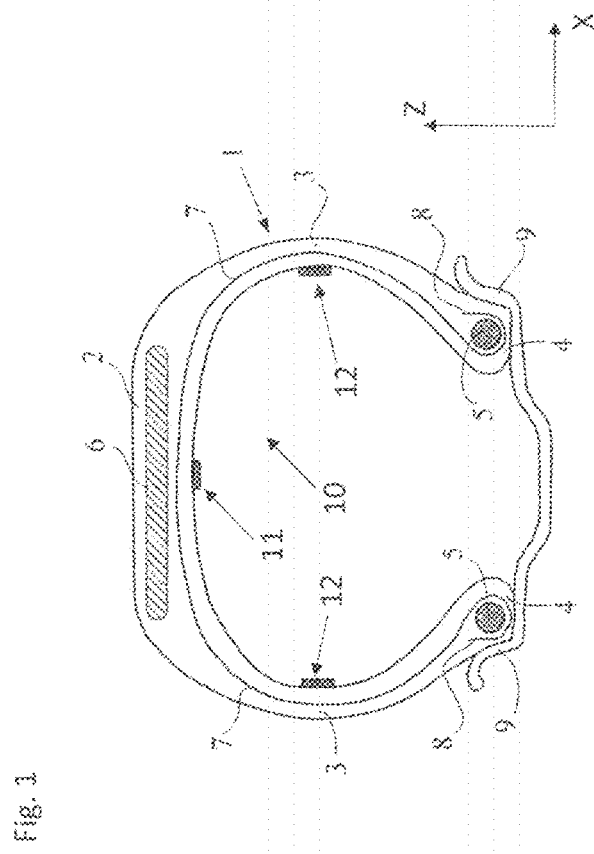
FIG. 1 is a diagrammatic representation in radial section of a tyre according to the invention.

For the preparation of the device successively comprising a layer E, a layer P and then a layer E, a curing mould is used. The following are successively arranged in this curing mould:
 the layer E in the form of a plaque with dimensions of 100 mm×100 mm×1 mm (l×w×t) (Length×Width×Thickness),
 the layer P in the form of a plaque with dimensions of 100 mm×100 mm×2 mm (l×w×t),
 the layer E in the form of a plaque with dimensions of 100 mm×100 mm×1 mm (l×w×t), Subsequently, the mould is placed in a plate press where the materials are cured at 170° C. under 12 tonnes of pressure for 20 minutes.

On conclusion of this operation, it is entirely possible to cut out the device with a hollow punch or any other cutting means in order to produce a device, in this case a piezoelectric composite with its two electrodes, having the shape and the size desired.

Polarization of the Samples

The output signal from a low-intensity generator is applied to the terminals of the test specimen (i.e. connected to the 2 layers E). The test specimens are thus polarized under a direct electric field of 4 kV, at the temperature of 100° C. and for 60 minutes. Once polarized, the sample is short-circuited in order to discharge a maximum of residual charges.

Equipment and Measurement

The measurement of the electromechanical response of these materials (characterization in deformation, characterization in cycling) is carried out on a dynamic measurement bench. The sample is pre-stretched by 1% and then it is stressed in extension by 1 to several % in deformation at the frequency indicated in the examples and at ambient temperature.

The signal generated by the piezocomposite is recovered at the terminals of the sample by a specific jaws platform, then amplified and measured on an oscilloscope.

The charge Q (pC) released at each mechanical stressing is deduced from the peak-to-peak voltage read on the oscilloscope. Thus the piezoelectric coefficient d31 (pC/N) can be calculated. The coefficient d31, known to a person skilled in the art, represents the coefficient measured by application of a stress in the direction orthogonal to the direction of polarization of the sample. In the case of a parallelepipedal sample, the direction of polarization corresponds to the smallest thickness (direction 3) and the stress is applied along the greatest length (direction 1).

The following notation can be adopted:

$$d31 = \Delta P3/\Delta \sigma 1,$$

with ΔP3 representing the macroscopic polarization variation in the direction 3 and Δσ1 representing the stress applied in the direction 1.

This coefficient is calculated by the following formula:

$$d31=[Q \text{ (pC)} \times \text{thickness (m)}]/[\text{Force (N)} \times \text{Length (m)}]$$

in the case where the electrode covers the entire surface of the test specimen.

Determination of the Molecular Weight of the Elastomers

The SEC (size exclusion chromatography) technique is used to determine the molecular weight distributions of the elastomers.

This technique has made it possible, starting from standard products, the characteristics of which are described in Example 1 of European Patent EP-A-692 493, to evaluate a number-average molecular weight for a sample.

According to this technique, the macromolecules are physically separated according to their respective sizes in the swollen state, in columns filled with a porous stationary phase. Before carrying out this separation, the polymer sample is dissolved at a concentration of approximately 1 g/l in tetrahydrofuran.

Use is made, for the abovementioned separation, of a chromatograph with the Waters name and under the model 150 C. The elution solvent is tetrahydrofuran, the flow rate is 1 ml/min, the temperature of the system is 35° C. and the analysis time is 30 min. A set of two Waters columns of Styragel HT6E type is used.

The injected volume of the solution of polymer sample is 100 µl. The detector is a Waters differential refractometer, the model of which is R401. Waters Millennium software, for making use of the chromatographic data, is also employed.

DETAILED DESCRIPTION

In the present description, any interval of values denoted by the expression "from a to b" represents the range of values extending from a up to b (that is to say, limits a and b included). Any interval "between a and b" represents the range of values extending from more than a to less than b (that is to say, limits a and b excluded).

The term "particles not bonded to the diene elastomer" is understood to mean particles without covalent bonds between the piezoelectric inorganic filler and the diene elastomer.

The term "phr" is understood to mean "parts by weight per hundred parts by weight of elastomer"; the elastomer comprises the diene elastomer and any other possible elastomer, including thermoplastic elastomers.

The expression "composition based on" should be understood as meaning a composition comprising the mixture and/or the product of the in situ reaction of the various base constituents used, some of these constituents being able to react and/or being intended to react with one another, at least partially, during the various phases of manufacture of the composition or during the subsequent curing, modifying the composition as it is prepared at the start. Thus, the compositions as employed for the invention can be different in the non-crosslinked state and in the crosslinked state.

The compounds mentioned in the description and participating in the preparation of rubber compositions or polymers can be of fossil or biosourced origin. In the latter case, they can result, partially or completely, from biomass or be obtained from renewable starting materials resulting from biomass. Polymers, plasticizers, fillers and the like are concerned in particular.

1. Rubber Composition of the Layer P

The layer P is a rubber composition based:
- on more than 50 parts by weight, per hundred parts by weight of elastomer, phr, of diene elastomer,
- on a crosslinking system,
- on at least 5% by volume, with respect to the total volume of the rubber composition, of piezoelectric inorganic fillers.

1.1 Diene Elastomer

"Diene" elastomer (or without distinction rubber), whether natural or synthetic, should be understood, in a known way, as meaning an elastomer composed, at least in part (i.e., a homopolymer or a copolymer), of diene monomer units (monomers bearing two conjugated or non-conjugated carbon-carbon double bonds).

These diene elastomers can be classified into two categories: "essentially unsaturated" or "essentially saturated". "Essentially unsaturated" is understood to mean generally a diene elastomer resulting at least in part from conjugated diene monomers having a content of units of diene origin (conjugated dienes) which is greater than 15% (mol %); thus it is that diene elastomers such as butyl rubbers or copolymers of dienes and of α-olefins of EPDM type do not come within the preceding definition and can in particular be described as "essentially saturated" diene elastomers (low or very low content, always less than 15%, of units of diene origin).

Diene elastomer capable of being used in the compositions in accordance with the invention is understood particularly to mean:
(a)—any homopolymer of a conjugated or non-conjugated diene monomer having from 4 to 18 carbon atoms;
(b)—any copolymer of a conjugated or non-conjugated diene having from 4 to 18 carbon atoms and of at least one other monomer.

The other monomer can be ethylene, an olefin or a conjugated or non-conjugated diene. Suitable as conjugated dienes are conjugated dienes having from 4 to 12 carbon atoms, especially 1,3-dienes, such as, in particular, 1,3-butadiene and isoprene.

Suitable as non-conjugated dienes are non-conjugated dienes having from 6 to 12 carbon atoms, such as 1,4-hexadiene, ethylidenenorbornene or dicyclopentadiene.

Suitable as olefins are vinylaromatic compounds having from 8 to 20 carbon atoms and aliphatic α-monoolefins having from 3 to 12 carbon atoms.

Suitable as vinylaromatic compounds are, for example, styrene, ortho-, meta- or para-methylstyrene, the "vinyltoluene" commercial mixture or para-(tert-butyl)styrene.

Suitable as aliphatic α-monoolefins are in particular acyclic aliphatic α-monoolefins having from 3 to 18 carbon atoms.

More particularly, the diene elastomer is:
(a')—any homopolymer of a conjugated diene monomer, in particular any homopolymer obtained by polymerization of a conjugated diene monomer having from 4 to 12 carbon atoms;
(b')—any copolymer obtained by copolymerization of one or more conjugated dienes with one another or with one or more vinylaromatic compounds having from 8 to 20 carbon atoms;
(c')—a copolymer of isobutene and of isoprene (butyl rubber) and also the halogenated versions, in particular chlorinated or brominated versions, of this type of copolymer;

(d')—any copolymer obtained by copolymerization of one or more conjugated or non-conjugated dienes with ethylene, an α-monoolefin or their mixture, such as, for example, the elastomers obtained from ethylene, from propylene with a non-conjugated diene monomer of the abovementioned type.

Preferentially, the diene elastomer is selected from the group consisting of polybutadienes (BRs), natural rubber (NR), synthetic polyisoprenes (IRs), butadiene copolymers, isoprene copolymers and the mixtures of these elastomers. The butadiene copolymers are particularly selected from the group consisting of butadiene/styrene copolymers (SBRs).

"Isoprene elastomer" is understood to mean, in a known way, an isoprene homopolymer or copolymer, in other words a diene elastomer selected from the group consisting of natural rubber (NR), synthetic polyisoprenes (IRs), various isoprene copolymers and the mixtures of these elastomers. Mention will in particular be made, among isoprene copolymers, of isobutene/isoprene (butyl rubber—IIR), isoprene/styrene (SIR), isoprene/butadiene (BIR) or isoprene/butadiene/styrene (SBIR) copolymers. This isoprene elastomer is preferably natural rubber or a synthetic cis-1,4-polyisoprene; use is preferably made, among these synthetic polyisoprenes, of polyisoprenes having a content (mol %) of cis-1,4-bonds of greater than 90%, more preferentially still of greater than 98%.

"Butadiene elastomer" is understood to mean, in a known way, a butadiene homopolymer or copolymer, in particular a diene elastomer selected from the group consisting of polybutadienes (BRs), various butadiene copolymers and the mixtures of these elastomers. Mention will in particular be made, among the butadiene copolymers, of butadiene/styrene (SBR), isoprene/butadiene (BIR) or isoprene/butadiene/styrene (SBIR) copolymers. This butadiene elastomer is preferably a cis-1,4-polybutadiene; use is preferably made, among these polybutadienes, of polybutadienes having a content (mol %) of cis-1,4-bonds of greater than 90%, more preferentially still of greater than 96%.

The following are suitable: polybutadienes and in particular those having a content (mol %) of 1,2-units of between 4% and 80% or those having a content (mol %) of cis-1,4-units of greater than 80%, polyisoprenes, butadiene/styrene copolymers and in particular those having a Tg (glass transition temperature (Tg), measured according to ASTM D3418-99) of between 0° C. and −90° C. and more particularly between −10° C. and −70° C., a styrene content of between 1% and 60% by weight and more particularly between 20% and 50%, a content (mol %) of 1,2-bonds of the butadiene part of between 4% and 75% and a content (mol %) of trans-1,4-bonds of between 10% and 80%, butadiene/isoprene copolymers and especially those having an isoprene content of between 5% and 90% by weight and a Tg of −40° C. to −80° C., or isoprene/styrene copolymers and especially those having a styrene content of between 5% and 50% by weight and a Tg of between −5° C. and −50° C. In the case of butadiene/styrene/isoprene copolymers, those having a styrene content of between 5% and 50% by weight and more particularly of between 10% and 40%, an isoprene content of between 15% and 60% by weight and more particularly of between 20% and 50%, a butadiene content of between 5% and 50% by weight and more particularly of between 20% and 40%, a content (mol %) of 1,2-units of the butadiene part of between 4% and 85%, a content (mol %) of trans-1,4-units of the butadiene part of between 6% and 80%, a content (mol %) of 1,2- plus 3,4-units of the isoprene part of between 5% and 70% and a content (mol %) of trans-1,4-units of the isoprene part of between 10% and 50%, and more generally any butadiene/styrene/isoprene copolymer having a Tg of between −5° C. and −70° C., are suitable in particular.

The diene elastomer can be modified, that is to say either coupled and/or star-branched, or functionalized, or coupled and/or star-branched and simultaneously functionalized.

Thus, the diene elastomer can be coupled and/or star-branched, for example by means of a silicon or tin atom which connects the elastomer chains together.

The diene elastomer can be simultaneously or alternatively functionalized and comprise at least one functional group. The term "functional group" is understood to mean a group comprising at least one heteroatom chosen from Si, N, S, O or P. Particularly suitable as functional groups are those comprising at least one function, such as: silanol, an alkoxysilane, a primary, secondary or tertiary amine which is cyclic or non-cyclic, a thiol or an epoxide.

In the context of functionalized elastomers, that is to say elastomers comprising at least one functional group:

The functional group can be located at the end of the elastomer chain; it will then be said that the diene elastomer is functionalized at the chain end.

The functional group can be located in the main linear elastomer chain; it will then be said that the diene elastomer is coupled or also functionalized in the middle of the chain, in contrast to the position "at the chain end", although the group is not located precisely in the middle of the main elastomer chain.

The functional group can be central and connect n elastomer chains (n>2), the elastomer being star-branched or branched.

The diene elastomer can comprise several functional groups, which are or are not pendant, distributed along the main chain of the elastomer; it will then be said that the diene elastomer is functionalized along the chain.

Suitable as functionalized elastomers are those prepared by the use of a functional initiator, in particular those bearing an amine function. Such functional elastomers and their processes of preparation are known to a person skilled in the art.

Also suitable as functionalized elastomers are those obtained by copolymerization of at least one diene monomer and of a monomer bearing a function.

Also suitable as functionalized elastomers are those obtained by post-polymerization modification by reaction with a functionalization agent introducing at least one function within the structure of the elastomer. Such functionalized elastomers and their processes of preparation are known to a person skilled in the art. Such a functionalization can thus be conventionally carried out by various reactions, for example by radical grafting to the diene elastomer, by a 1,3-dipolar reaction with the diene elastomer, by reaction of the (pseudo)living diene elastomer obtained on conclusion of a coordination or anionic polymerization with a functionalization agent.

The number-average molecular weight (denoted Mn) of the diene elastomer advantageously varies from 50 000 g/mol to 400 000 g/mol, advantageously from 80 000 g/mol to 370 000 g/mol, more advantageously still from 100 000 g/mol to 150 000 g/mol.

The rubber composition forming the layer P can contain a single diene elastomer or a mixture of several diene elastomers.

If optional other elastomers are used in the rubber composition, the diene elastomer(s) constitute the predominant fraction by weight; they then represent more than 50% by weight, more preferentially at least 75% by weight, with respect to the total weight of the elastomers in the rubber composition. Preferentially again, the diene elastomer(s) represent at least 90%, indeed even 95% (in particular 100%), by weight, with respect to the total weight of the elastomers in the rubber composition.

The diene elastomer is the predominant elastomer by weight of the rubber composition.

Thus, the rubber composition comprises more than 50 phr of diene elastomer, and thus from more than 50 phr to 100 phr of diene elastomer, advantageously from 75 phr to 100 phr, more advantageously from 90 phr to 100 phr, more advantageously still from 95 phr to 100 phr, of diene elastomer.

In a preferred alternative form of the invention, the diene elastomer or the mixture of diene elastomers is the only elastomer of the rubber composition (thus corresponding to 100 phr).

1.2 Other Elastomer

In another alternative form of the invention, the rubber composition can comprise another elastomer, in a content strictly of less than 50 phr.

This other elastomer can in particular be a thermoplastic elastomer (abbreviated to "TPE").

1.2.1 Thermoplastic Elastomer

TPEs have a structure intermediate between elastomers and thermoplastic polymers. They are block copolymers consisting of rigid thermoplastic blocks connected by flexible elastomer blocks.

The thermoplastic elastomer used for the implementation of the invention is a block copolymer, the chemical nature of the thermoplastic blocks and elastomer blocks of which can vary.

The number-average molecular weight (denoted Mn) of the TPE is preferentially between 30 000 and 500 000 g/mol, more preferentially between 40 000 and 400 000 g/mol. The number-average molecular weight (Mn) of the TPE elastomer is determined, in a known way, by size exclusion chromatography (SEC). For example, in the case of thermoplastic styrene elastomers, the sample is dissolved beforehand in tetrahydrofuran at a concentration of approximately 1 g/l and then the solution is filtered through a filter with a porosity of 0.45 µm before injection. The apparatus used is a Waters Alliance chromatographic line. The elution solvent is tetrahydrofuran, the flow rate is 0.7 ml/min, the temperature of the system is 35° C. and the analysis time is 90 min. A set of four Waters columns in series, with the Styragel tradenames (HMW7, HMW6E and two HT6Es), is used. The injected volume of the solution of the polymer sample is 100 µl. The detector is a Waters 2410 differential refractometer and its associated software, for making use of the chromatographic data, is the Waters Millennium system. The calculated average molar masses are relative to a calibration curve produced with polystyrene standards. The conditions can be adjusted by a person skilled in the art.

The value of the polydispersity index PI (reminder: PI=Mw/Mn, with Mw the weight-average molecular weight and Mn the number-average molecular weight) of the TPE is preferably less than 3, more preferentially less than 2 and more preferentially still less than 1.5.

In a known way, TPEs exhibit two glass transition temperature (Tg, measured according to ASTM D3418) peaks, the lowest temperature being relative to the elastomer part of the TPE and the highest temperature being relative to the thermoplastic part of the TPE. Thus, the flexible blocks of the TPEs are defined by a Tg which is less than ambient temperature (25° C.), while the rigid blocks have a Tg of greater than 80° C.

In order to be both elastomeric and thermoplastic in nature, the TPE has to be provided with blocks which are sufficiently incompatible (that is to say, different as a result of their respective masses, of their respective polarities or of their respective Tg values) to retain their own properties of elastomer or thermoplastic block.

The TPEs can be copolymers with a small number of blocks (less than 5, typically 2 or 3), in which case these blocks preferably have high weights of greater than 15 000 g/mol. These TPEs can, for example, be diblock copolymers, comprising a thermoplastic block and an elastomer block. These are often also triblock elastomers with two rigid segments connected by a flexible segment. The rigid and flexible segments can be positioned linearly, in a star-branched or branched configuration. Typically, each of these segments or blocks often contains a minimum of more than 5, generally of more than 10, base units (for example, styrene units and butadiene units for a styrene/butadiene/styrene block copolymer).

The TPEs can also comprise a large number of smaller blocks (more than 30, typically from 50 to 500), in which case these blocks preferably have relatively low weights, for example from 500 to 5000 g/mol; these TPEs will be referred to subsequently as multiblock TPEs and are an elastomer block/thermoplastic block sequence.

The elastomer blocks of the TPE for the requirements of the invention can be any elastomer described above for the diene elastomer. They preferably have a Tg of less than 25° C., preferentially of less than 10° C., more preferentially of less than 0° C. and very preferentially of less than −10° C. Also preferentially, the elastomer block Tg of the TPE is greater than −100° C.

Use will be made, for the definition of the thermoplastic blocks, of the characteristic of glass transition temperature (Tg) of the rigid thermoplastic block. This characteristic is well known to a person skilled in the art. It makes it possible in particular to choose the industrial processing (transformation) temperature. In the case of an amorphous polymer (or polymer block), the processing temperature is chosen to be substantially greater than the Tg. In the specific case of a semi-crystalline polymer (or polymer block), a melting point may be observed which is then greater than the glass transition temperature. In this case, it is instead the melting point (M.p.) which makes it possible to choose the processing temperature for the polymer (or polymer block) under consideration. Thus, subsequently, when reference is made to "Tg (or M.p., if appropriate)", it should be considered that this is the temperature used to choose the processing temperature.

For the requirements of the invention, the TPE elastomers comprise one or more thermoplastic block(s) preferably having a Tg (or M.p., if appropriate) of greater than or equal to 80° C. and formed from polymerized monomers. Preferably, this thermoplastic block has a Tg (or M.p, if appropriate) within a range varying from 80° C. to 250° C. Preferably, the Tg (or M.p., if appropriate) of this thermoplastic block is preferentially from 80° C. to 200° C., more preferentially from 80° C. to 180° C.

The proportion of the thermoplastic blocks, with respect to the TPE as defined for the implementation of the invention, is determined, on the one hand, by the thermoplasticity properties which the said copolymer has to exhibit. The thermoplastic blocks having a Tg (or M.p., if appropriate) of greater than or equal to 80° C. are preferentially present in proportions sufficient to retain the thermoplastic nature of the elastomer according to the invention. The minimum content of thermoplastic blocks having a Tg (or M.p., if appropriate) of greater than or equal to 80° C. in the TPE can vary as a function of the conditions of use of the copolymer. On the other hand, the ability of the TPE to deform during the preparation of the tyre can also contribute to determining the proportion of the thermoplastic blocks having a Tg (or M.p., if appropriate) of greater than or equal to 80° C.

For example, the TPE is a copolymer, the elastomer part of which is saturated and which comprises styrene blocks and alkylene blocks. The alkylene blocks are preferentially of ethylene, propylene or butylene. More preferentially, this TPE elastomer is selected from the following group consisting of diblock or triblock copolymers which are linear or star-branched: styrene/ethylene/butylene (SEB), styrene/ethylene/propylene (SEP), styrene/ethylene/ethylene/propylene (SEEP), styrene/ethylene/butylene/styrene (SEBS), styrene/ethylene/propylene/styrene (SEPS), styrene/ethylene/ethylene/propylene/styrene (SEEPS), styrene/isobutylene (SIB), styrene/isobutylene/styrene (SIBS) and the mixtures of these copolymers.

According to another example, the TPE is a copolymer, the elastomer part of which is unsaturated and which comprises styrene blocks and diene blocks, these diene blocks being in particular isoprene or butadiene blocks. More preferably, this TPE elastomer is selected from the following group consisting of diblock or triblock copolymers which are linear or star-branched: styrene/butadiene (SB), styrene/isoprene (SI), styrene/butadiene/isoprene (SBI), styrene/butadiene/styrene (SBS), styrene/isoprene/styrene (SIS), styrene/butadiene/isoprene/styrene (SBIS) and the mixtures of these copolymers.

For example again, the TPE is a linear or star-branched copolymer, the elastomer part of which comprises a saturated part and an unsaturated part, such as, for example, styrene/butadiene/butylene (SBB), styrene/butadiene/butylene/styrene (SBBS) or a mixture of these copolymers.

Mention may be made, among multiblock TPEs, of the copolymers comprising random copolymer blocks of ethylene and propylene/polypropylene, polybutadiene/polyurethane (TPU), polyether/polyester (COPE) or polyether/polyamide (PEBA).

It is also possible for the TPEs given as example above to be mixed with one another within the TPE matrix according to the invention.

Mention may be made, as examples of commercially available TPE elastomers, of the elastomers of SEPS, SEEPS or SEBS type sold by Kraton under the Kraton G name (e.g., G1650, G1651, G1654 and G1730 products) or Kuraray under the Septon name (e.g., Septon 2007, Septon 4033 or Septon 8004), or the elastomers of SIS type sold by Kuraray under the name Hybrar 5125 or sold by Kraton under the name D1161, or also the elastomers of linear SBS type sold by Polimeri Europa under the name Europrene SOL T 166 or of star-branched SBS type sold by Kraton under the name D1184. Mention may also be made of the elastomers sold by Dexco Polymers under the Vector name (e.g. Vector 4114 or Vector 8508). Mention may be made, among multiblock TPEs, of the Vistamaxx TPE sold by Exxon; the COPE TPE sold by DSM under the Arnitel name or by DuPont under the Hytrel name or by Ticona under the Riteflex name; the PEBA TPE sold by Arkema under the PEBAX name; or the TPU TPE sold by Sartomer under the name TPU 7840 or by BASF under the Elastogran name.

1.3 Crosslinking System

The crosslinking system can be any type of system known to a person skilled in the art in the field of rubber compositions for tyres. It can in particular be based on sulfur, and/or on peroxide and/or on bismaleimides.

According to a preferred embodiment, the crosslinking system is based on sulfur; it is then called a vulcanization system. The sulfur can be contributed in any form, in particular in the form of molecular sulfur, or of a sulfur-donating agent. At least one vulcanization accelerator is also preferentially present, and, optionally, also preferentially, use may be made of various known vulcanization activators, such as zinc oxide, stearic acid or equivalent compound, such as stearic acid salts, and salts of transition metals, guanidine derivatives (in particular diphenylguanidine), or also known vulcanization retarders.

When it is present, the sulfur is used at a preferential content of between 0.5 and 12 phr, in particular between 1 and 10 phr. The vulcanization accelerator is used at a preferential content of between 0.5 and 10 phr, more preferentially of between 0.5 and 5.0 phr.

Use may be made, as accelerator, of any compound capable of acting as accelerator of the vulcanization of diene elastomers in the presence of sulfur, in particular accelerators of the thiazole type, and also their derivatives, or accelerators of sulfenamide, thiuram, dithiocarbamate, dithiophosphate, thiourea and xanthate types. Mention may in particular be made, as examples of such accelerators, of the following compounds: 2-mercaptobenzothiazyl disulfide (abbreviated to MBTS), N-cyclohexyl-2-benzothiazole-sulfenamide (CBS), N,N-dicyclohexyl-2-benzothiazole-sulfenamide (DCBS), N-(tert-butyl)-2-benzothiazole-sulfenamide (TBBS), N-(tert-butyl)-2-benzothiazolesulfenimide (TBSI), tetrabenzylthiuram disulfide (TBZTD), zinc dibenzyldithiocarbamate (ZBEC) and the mixtures of these compounds.

According to another preferential embodiment, the crosslinking system preferentially contains a peroxide. Advantageously, the peroxide is the only crosslinking agent. Thus, advantageously, according to this embodiment, the composition does not comprise a vulcanization system, that is to say a sulfur-based crosslinking system.

The peroxide which can be used according to the invention can be any peroxide known to a person skilled in the art. Preferably, the peroxide is chosen from organic peroxides.

The term "organic peroxide" is understood to mean an organic compound, that is to say a compound containing carbon, comprising an —O—O— group (two oxygen atoms connected by a covalent single bond).

During the crosslinking process, the organic peroxide decomposes at its unstable O—O bond to give free radicals. These free radicals make possible the creation of the crosslinking bonds.

According to one embodiment, the organic peroxide is selected from the group consisting of dialkyl peroxides, monoperoxycarbonates, diacyl peroxides, peroxyketals, peroxyesters and their mixtures.

Preferably, the dialkyl peroxides are selected from the group consisting of dicumyl peroxide, di(t-butyl) peroxide, t-butyl cumyl peroxide, 2,5-dimethyl-2,5-di(t-butylperoxy)hexane, 2,5-dimethyl-2,5-di(t-amylperoxy)hexane, 2,5-dimethyl-2,5-di(t-butylperoxy)hex-3-yne, 2,5-dimethyl-2,5-di(t-amylperoxy)hex-3-yne, α,α'-di[(t-butylperoxy)isopropyl]benzene, α,α'-di[(t-amylperoxy)isopropyl]benzene, di(t-amyl) peroxide, 1,3,5-tri[(t-butylperoxy)isopropyl]benzene, 1,3-dimethyl-3-(t-butylperoxy)butanol, 1,3-dimethyl-3-(t-amylperoxy)butanol and their mixtures.

Some monoperoxycarbonates, such as OO-tert-butyl O-(2-ethylhexyl) monoperoxycarbonate, OO-tert-butyl O-isopropyl monoperoxycarbonate, OO-tert-amyl O-(2-ethylhexyl) monoperoxycarbonate, and their mixtures, can also be used.

Among the diacyl peroxides, the preferred peroxide is benzoyl peroxide.

Among the peroxyketals, the preferred peroxides are selected from the group consisting of 1,1-di(t-butylperoxy)-3,3,5-trimethylcyclohexane, n-butyl 4,4-di(t-butylperoxy) valerate, ethyl 3,3-di(t-butylperoxy)butyrate, 2,2-di(t-amylperoxy)propane, 3,6,9-triethyl-3,6,9-trimethyl-1,4,7-triperoxynonane (or methyl ethyl ketone peroxide cyclic trimer), 3,3,5,7,7-pentamethyl-1,2,4-trioxepane, n-butyl 4,4-bis(t-amylperoxy)valerate, ethyl 3,3-di(t-amylperoxy)butyrate, 1,1-di(t-butylperoxy)cyclohexane, 1,1-di(t-amylperoxy)cyclohexane and their mixtures.

Preferably, the peroxyesters are selected from the group consisting of tert-butyl peroxybenzoate, tert-butyl peroxy-2-ethylhexanoate, tert-butyl peroxy-3,5,5-trimethylhexanoate and their mixtures.

Particularly preferably, the organic peroxide is selected from the group consisting of dicumyl peroxide, aryl or diaryl peroxides, diacetyl peroxide, benzoyl peroxide, dibenzoyl peroxide, di(tert-butyl) peroxide, tert-butyl cumyl peroxide, 2,5-bis(tert-butylperoxy)-2,5-dimethylhexane, n-butyl 4,4'-di(tert-butylperoxy)valerate, OO-(t-butyl) O-(2-ethylhexyl) monoperoxycarbonate, tert-butyl peroxyisopropyl carbonate, tert-butyl peroxybenzoate, tert-butyl peroxy-3,5,5-trimethylhexanoate, 1,3(4)-bis(tert-butylperoxyisopropyl)benzene and the mixtures of the latter, more preferentially from the group consisting of dicumyl peroxide, n-butyl 4,4'-di(tert-butylperoxy)valerate, OO-(t-butyl)O-(2-ethylhexyl) monoperoxycarbonate, tert-butyl peroxyisopropyl carbonate, tert-butyl peroxybenzoate, tert-butyl peroxy-3,5,5-trimethylhexanoate, 1,3(4)-bis(tert-butylperoxyisopropyl)benzene and the mixtures of the latter.

When it is present, the total content of peroxide in the composition is preferably greater than or equal to 0.3 phr, more preferentially greater than or equal to 0.75 phr, preferably within a range extending from 0.5 to 5 phr, in particular from 0.5 to 3 phr.

1.4 Piezoelectric Inorganic Fillers

The piezoelectric inorganic fillers are advantageously dispersed in the rubber composition. Advantageously, the piezoelectric inorganic fillers are in the form of particles not bonded to the diene elastomer.

The piezoelectric inorganic fillers comprise piezoelectric inorganic compounds. These can be piezoelectric single crystals or piezoelectric ceramics.

The piezoelectric single crystals are in particular natural piezoelectric materials, such as quartz or tourmaline. Ferroelectric crystals can have a domain structure. Monodomain and polydomain single crystals can be distinguished according to whether one or more polarization directions coexist in the crystal.

The ceramics are piezoelectric materials with strong electromechanical coupling and high density. The ceramics derive their piezoelectric property from their crystalline structure, through the absence of symmetry of the crystal unit cell, which splits up the centres of gravity of the positive and negative charges, each unit cell then constituting an electric dipole. The crystal unit cell thus has a permanent dipole which gives these materials high dielectric permittivity values. Synthetic ceramics are in particular composed of ferroelectric oxides, which have the property of possessing an electric polarization in the spontaneous state, which can furthermore be reversed by the application of a sufficiently intense external electric field.

Advantageously, the piezoelectric inorganic fillers are piezoelectric ceramics.

Advantageously, the piezoelectric inorganic fillers are ferroelectric oxides.

The ferroelectric oxides can in particular be endowed with a perovskite structure. They advantageously correspond to a general formula $ABO_3$, such as barium titanate ($BaTiO_3$), lead titanate ($PbTiO_3$), potassium niobate ($KNbO_3$), lead niobate ($PbNbO_3$) or bismuth ferrite ($BiFeO_3$). In this family of piezoelectric materials, mention may also be made of lead zirconate titanate (PZT) with a $Pb(Zr_xTi_{1-x})O_3$ structure in which x is between 0 and 1. It can be in pure form or in the form of a semiconductor doped either with acceptor dopants (to give a "hard" PZT), such as Fe, Co, Mn, Mg, Al, In, Cr, Sc, Na or K, or with donor dopants (to give a "soft" PZT), such as La, Nd, Sb, Ta, Nb or W.

As nonlimiting examples, the piezoelectric inorganic fillers can be selected from the group comprising barium titanate, lead titanate, lead zirconate titanate (PZT), lead niobate, lithium niobate and potassium niobate; advantageously, the piezoelectric inorganic fillers are barium titanate fillers.

Both barium titanate and potassium niobate are lead-free piezoelectric materials. They have the advantage of being less toxic.

The most well-known piezoelectric ceramics are barium titanate ($BaTiO_3$) and lead zirconate titanate (PZT), which have a very good electromechanical coefficient and offer a variety of manufacturing processes. The latter (sol-gel process, hydrothermal synthesis, calcination, and the like) make it possible to modify the dielectric, mechanical and piezoelectric properties depending on the application targeted.

The fillers advantageously have the form of particles. In particular, the fillers have particle sizes of between 50 nm and 500 µm. The size of the particles corresponds to the average diameter of the particles. The measurement of the average diameter is performed by scanning electron microscopy (SEM) analysis. Photographs are taken on powder samples. Image analysis is carried out using software and makes it possible to attain the average diameter of the particles present.

The Curie temperature, Tc, of a piezoelectric material corresponds to the temperature at which the material becomes paraelectric. Thus, the characteristic hysteresis cycle of the piezoelectric material, which is obtained by plotting the polarization as a function of the electric field applied to the material, disappears when the Curie temperature is reached. The Curie temperature is characteristic of the piezoelectric material.

The loading content of the piezoelectric inorganic fillers is at least 5% by volume, with respect to the total volume of the rubber composition.

In particular, the content of piezoelectric inorganic fillers varies from 5% to 80% by volume, with respect to the total volume of the rubber composition, advantageously from 5% to 60%, more advantageously still from 5% to 50%. The content of piezoelectric inorganic fillers is at least 5% by volume, in particular at least 6% by volume, indeed even 7% by volume, with respect to the total volume of the rubber composition.

Advantageously, the layer P is of 0-3 connectivity, comprising particles of piezoelectric fillers dispersed in the diene elastomer. The connectivity depends on the spatial organization of each constituent phase of the composite material. A change in connectivity results in major changes in the physical properties of the composites. In the case of two-phase systems, the nature of the connectivity is represented by two numbers (the first for the ceramic, the second for the matrix). They indicate the number of directions connected by the phase under consideration. Thus, a 0-3 connectivity composite corresponds to a composite formed by piezoelectric powder grains dispersed in the diene elastomer. The main advantage of this type of composite is the ease of implementation of the process, or else the ease of producing complex shapes, such as curved surfaces.

1.5—Other Additives

The rubber composition of the layer P according to the invention optionally also comprises all or a portion of the normal additives generally used in elastomer compositions intended in particular for the manufacture of tyres, such as, for example, pigments, protective agents, such as antiozone waxes, chemical antiozonants or antioxidants, plasticizing agents, such as plasticizing oils or hydrocarbon resins well known to a person skilled in the art, reinforcing resins, or methylene acceptors (for example novolak phenolic resin) or donors (for example HMT or H3M).

Advantageously, the layer P does not include conductive fillers. In the case where conductive fillers are also present in this layer P, the content of conductive fillers is advantageously less than 5% by volume, with respect to the total volume of the rubber composition, more advantageously less than 1% by volume, with respect to the total volume of the rubber composition. In the case where conductive fillers are also present in this layer P, the content of conductive fillers is advantageously less than 0.3 phr.

2. Rubber Composition of the Layer E

Each layer E is a rubber composition based:
on at least 50 phr of diene elastomer,
on a crosslinking system,
on conductive fillers.

2.1 Diene Elastomer

The diene elastomer of each layer E corresponds to the same definition as that given above for the diene elastomer of the layer P.

The diene elastomers of each layer E can be identical or different; they are advantageously identical. In addition, the diene elastomers of each layer E and of the layer P can be identical or different; they are advantageously identical.

The rubber composition forming each layer E can contain a single diene elastomer or a mixture of several diene elastomers.

If optional other elastomers are used in the rubber composition, the diene elastomer(s) constitute the predominant fraction by weight; they then represent more than 50% by weight, more preferentially at least 75% by weight, with respect to the total weight of the elastomers in the rubber composition. Preferentially again, the diene elastomer(s) represent at least 90%, indeed even 95% (in particular 100%), by weight, with respect to the total weight of the elastomers in the rubber composition.

The diene elastomer is the predominant elastomer by weight of the rubber composition. Thus, the rubber composition comprises more than 50 phr of diene elastomer, and thus from more than 50 phr to 100 phr of diene elastomer, advantageously from 75 phr to 100 phr, more advantageously from 90 phr to 100 phr, more advantageously still from 95 phr to 100 phr, of diene elastomer.

In a preferred alternative form of the invention, the diene elastomer or the mixture of diene elastomers is the only elastomer of the rubber composition (thus corresponding to 100 phr).

2.2 Other Elastomer

In another alternative form of the invention, the rubber composition can comprise another elastomer, in a content strictly of less than 50 phr.

This other elastomer can in particular be a thermoplastic elastomer (abbreviated to "TPE").

2.2.1 Thermoplastic Elastomer

The thermoplastic elastomer of each layer E corresponds to the same definition as that given above for the diene elastomer of the layer P.

The thermoplastic elastomers of each layer E can be identical or different; they are advantageously identical. In addition, the thermoplastic elastomers of each layer E and of the layer P can be identical or different; they are advantageously identical.

2.3 Crosslinking System

The crosslinking system of the rubber composition of the invention for each layer E can be any type of system known to a person skilled in the art in the field of rubber compositions for tyres. It can in particular be based on sulfur, and/or on peroxide and/or on bismaleimides.

According to a preferential embodiment, in one or each layer E, the crosslinking system is based on sulfur. This vulcanization system can be as described above for the rubber composition of the the layer P.

When it is present, the sulfur is used at a preferential content of between 0.5 and 12 phr, in particular between 1 and 10 phr. The vulcanization accelerator is used at a preferential content of between 0.5 and 10 phr, more preferentially of between 0.5 and 5.0 phr.

As described above, the crosslinking system can also comprise an accelerator.

According to another preferential embodiment, in one or each layer E, the crosslinking system preferentially contains a peroxide. Advantageously, the peroxide is the only crosslinking agent. Thus, advantageously, according to this embodiment, the composition does not comprise a vulcanization system, that is to say a sulfur-based crosslinking system. When it is present, the total content of peroxide in the composition is preferably greater than or equal to 0.3 phr, more preferentially greater than or equal to 0.75 phr, preferably within a range extending from 0.5 to 5 phr, in particular from 0.5 to 3 phr.

The peroxide which can be used according to the invention is advantageously as described above for the rubber composition of the layer P.

The crosslinking systems of each layer E can be identical or different; they are advantageously identical. In addition, the crosslinking systems of the rubber compositions of each layer E and of the layer P can be identical or different; they are advantageously identical.

2.4 Conductive Fillers

The conductive fillers are advantageously dispersed in the rubber composition.

In a way known to a person skilled in the art, a conductive filler is a compound which, introduced into a medium, in the presence of an electric current, brings about the appearance of an electric current in the medium.

The conductive filler is a graphitized or partially graphitized carbon black, also known as conductive blacks. These conductive blacks are, for example, sold by Timcal under the trade name "Ensaco 350G", with a specific surface (BET, measured according to Standard ASTM D3037) of 770 $m^2/g$, or "Ensaco 260G", with a specific surface of 70 $m^2/g$. Very preferentially, the conductive filler is an electroconductive or graphitized carbon black with a specific surface (BET, measured by Standard ASTM D3037) of greater than 65 $m^2/g$, more preferentially of greater than 100 $m^2/g$ and very preferentially of greater than 500 $m^2/g$. The amount of conductive filler in the rubber composition of each layer E of the invention is preferentially within a range extending from 10% to 40% by volume, preferably from 15% to 30% by volume. These preferential contents by volume correspond approximately to contents in phr, also preferential, within a range extending from 20 to 50 phr, preferably from 20 to 40 phr and more preferentially from 25 to 40 phr.

Mention may in particular be made, as examples for conductive blacks, of the conductive carbon black "Ensaco 260 G" from Timcal or the conductive carbon black "Ensaco 350 G" from Timcal.

The size of the conductive fillers advantageously varies from 50 nm to 500 μm.

2.5 Other Additives

The rubber composition of each layer E according to the invention optionally also comprises all or a portion of the normal additives generally used in elastomer compositions intended in particular for the manufacture of tyres, such as, for example, pigments, protective agents, such as antiozone waxes, chemical antiozonants or antioxidants, plasticizing agents, such as plasticizing oils or hydrocarbon resins well known to a person skilled in the art, reinforcing resins, or methylene acceptors (for example novolak phenolic resin) or donors (for example HMT or H3M).

Advantageously, each layer E does not comprise piezoelectric inorganic fillers. In the case where piezoelectric inorganic fillers are also present in a layer E, the content of piezoelectric inorganic fillers is advantageously less than 5% by volume, with respect to the total volume of the rubber composition, more advantageously less than 1% by volume, with respect to the total volume of the rubber composition.

Each layer E forms an electrode.

The electrodes are deposited on the faces of the piezoelectric composite, forming the layer P, according to the invention in order to collect the charges emitted by the said composite. The device according to the invention is advantageously connected to an electronic member in order to capture the electrical pulses emitted and to use this information.

3. Device According to the Invention

According to the invention, the diene elastomer of the layer P is co-crosslinked with the diene elastomer of each layer E. Thus, the different layers are advantageously bonded together covalently, making it possible to obtain a device which is cohesive.

4. Preparation Process 4.1 Polarization

Another subject-matter of the invention is a process for the preparation of a polarized device according to the invention comprising a stage of polarization, in this instance denoted (a4), of a device as described above.

The stage of polarization of the device corresponds to the application of an electric field to the terminals of the electroactive device in order to orient the dipoles of the piezoelectric fillers in the same direction in order to obtain a macroscopic polarization of the device. The polarization depends on the polarization temperature, on the electric field applied and on the polarization time.

Advantageously, the polarization temperature is at least lower by 5° C., with respect to the lowest Curie temperature, Tc, of the piezoelectric inorganic fillers, more advantageously at least 7° C. less, more advantageously still at least 10° C. less, than the lowest Curie temperature, Tc, of the piezoelectric inorganic fillers. This is because, close to the Curie temperature of the piezoelectric inorganic fillers, the agitation of the dipoles makes it more difficult to align them under an electric field.

In particular, the electric field applied during the polarization stage is between 0.5 and 8 kV/mm, advantageously between 0.75 and 4 kV/mm.

In particular, the electric field applied depends on the nature of the piezoelectric filler and on the polarization time of the piezoelectric composite. A person skilled in the art knows how to adjust the electric field to the piezoelectric filler and to the polarization time.

In particular, the polarization time is between 1 minute and 10 hours, preferably between 5 minutes and 2 hours.

The device can be polarized after manufacture, before incorporation in the tyre. In particular, the device according to the invention can be manufactured; then cut to the desired dimensions and polarized, these two stages being able to be carried out in any order, and thus it is possible to cut to the desired dimensions, then polarize, or to polarize, then cut to the desired dimensions; and finally to adhesively bonde to the tyre. The device will advantageously be adhesively bonded in the internal wall of a tyre, as described subsequently.

Alternatively, the device according to the invention can be polarized after its incorporation in a tyre. Advantageously, in such an option, the tyre is still in the raw state, that is to say that the device is incorporated in the tyre before the said tyre is cured.

4.2 Manufacture of the Device

Another subject-matter of the invention is a process for the preparation of a device according to the invention, comprising the following stages:

(a1) placing at least one piezoelectric composite layer P between two identical or different conductive composite layers E, in order to obtain an assembly;

(a2) applying a pressure to the assembly obtained following stage (a1);

(a3) crosslinking the assembly in order to obtain the device according to the invention.

During stage (a1), the layers are advantageously successively deposited in a suitable mould, known as curing mould, which can have any dimension.

During stage (a2), a pressure ranging from 1 000 000 to 3 000 000 Pa, advantageously ranging from 1 600 000 to 2 400 000 Pa, is applied to the assembly. The duration of the compression is adjusted according to the pressure chosen; it can, for example, last from 5 min to 90 min.

Stage (a3) is carried out by curing, that is to say by heating the assembly to a temperature generally of between 130° C. and 200° C., for a sufficient time which can vary, for example, between 5 and 90 min depending in particular on the curing temperature, on the crosslinking system adopted and on the crosslinking kinetics of the composition under consideration.

Stages (a2) and (a3) can be simultaneous. For example, when the layers are deposited in a curing mould, this mould can be deposited in a plate press, where the assembly will be cured under pressure.

The rubber compositions of the layer P and of each layer E are manufactured in appropriate mixers, using, for example, two successive phases of preparation according to a general procedure well known to a person skilled in the art: a first phase of thermomechanical working or kneading (sometimes described as "non-productive" phase) at high temperature, up to a maximum temperature of between 80° C. and 190° C., preferably between 80° C. and 150° C., followed by a second phase of mechanical working (sometimes described as "productive" phase) at lower temperature, typically below 80° C., for example between 60° C. and 80° C., during which finishing phase the crosslinking system is incorporated.

A process which can be used for the manufacture of such rubber compositions comprises, for example and preferably, the following stages:
- incorporating the filler and the optional other ingredients of the composition, with the exception of the crosslinking system, in the diene elastomer in a mixer, everything being kneaded thermomechanically, in one or more goes, until a maximum temperature of between 80° C. and 190° C. is reached;
- cooling the combined mixture to a temperature of less than 80° C.;
- subsequently incorporating the crosslinking system;
- kneading everything up to a maximum temperature of less than 80° C.;
- extruding or calendering the rubber composition thus obtained.

By way of example, the first (non-productive) phase is carried out in a single thermomechanical stage during which all the necessary constituents, the various additives, with the exception of the crosslinking system, are introduced into an appropriate mixer, such as an ordinary internal mixer. After cooling the mixture thus obtained during the first non-productive phase, the crosslinking system is then incorporated at low temperature, generally in an external mixer, such as an open mill; everything is then mixed (productive phase) for a few minutes, for example between 5 and 15 min.

The final composition thus obtained can subsequently be calendered, for example in the form of a sheet or a plaque or also extruded, for example in order to form a rubber profiled element.

The piezoelectric composite layer P is advantageously prepared by a process comprising the following stages:
- (b1) incorporating a piezoelectric inorganic filler in a diene elastomer, in a mixer, everything being thermomechanically kneaded, in one or more goes, until a maximum temperature of between 80° C. and 190° C. is reached, then
- (b2) cooling the combined mixture to a temperature of less than 80° C.;
- (b3) subsequently incorporating a crosslinking system;
- (b4) kneading everything up to a maximum temperature of less than 80° C.;
- (b5) calendering or extruding the rubber composition thus obtained in the form of a strip.

Each conductive composite layer E is advantageously prepared by a process comprising the following stages:
- (c1) incorporating a conductive filler in a diene elastomer, in a mixer, everything being thermomechanically kneaded, in one or more goes, until a maximum temperature of between 80° C. and 190° C. is reached;
- (c2) cooling the combined mixture to a temperature of less than 80° C.;
- (c3) subsequently incorporating a crosslinking system;
- (c4) kneading everything up to a maximum temperature of less than 80° C.;
- (c5) calendering or extruding the rubber composition thus obtained in the form of a strip.

The preparation process advantageously comprises a stage of polarization (a4) of the device obtained following stage (a3), advantageously at a polarization temperature lower by at least 5° C. than the lowest Curie temperature, Tc, of the piezoelectric inorganic fillers. This polarization stage (a4) is advantageously as described above.

5. Tyre Comprising a Device According to the Invention

Another subject-matter of the invention is a tyre comprising a device according to the invention.

The tyre is advantageously a tyre having a radial carcass reinforcement intended in particular to equip passenger vehicles or heavy-duty vehicles.

The device according to the invention can be used in different parts of the tyre, in particular in the crown, and the zone of the sidewall.

General Architecture of the Tyre

Figure 2:
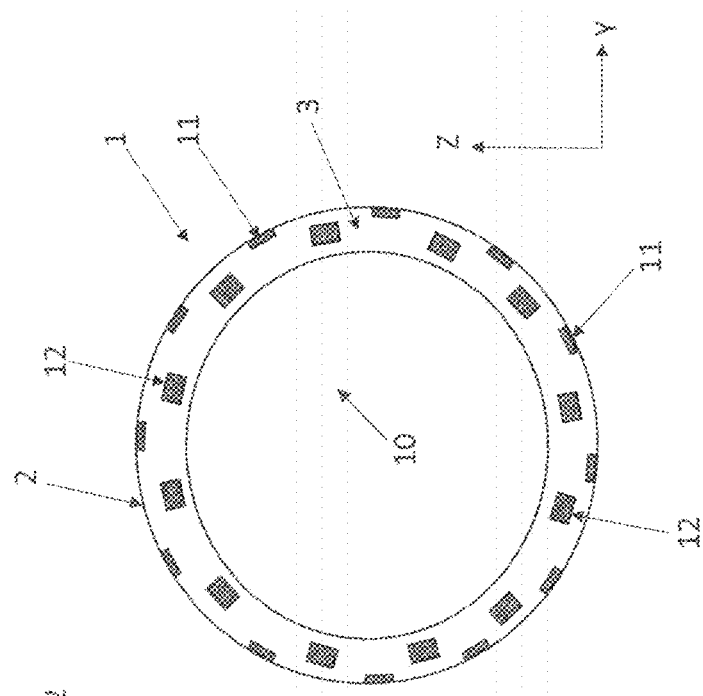
FIG. 2 is a diagrammatic side representation of a tyre according to the invention.
Figure 3:
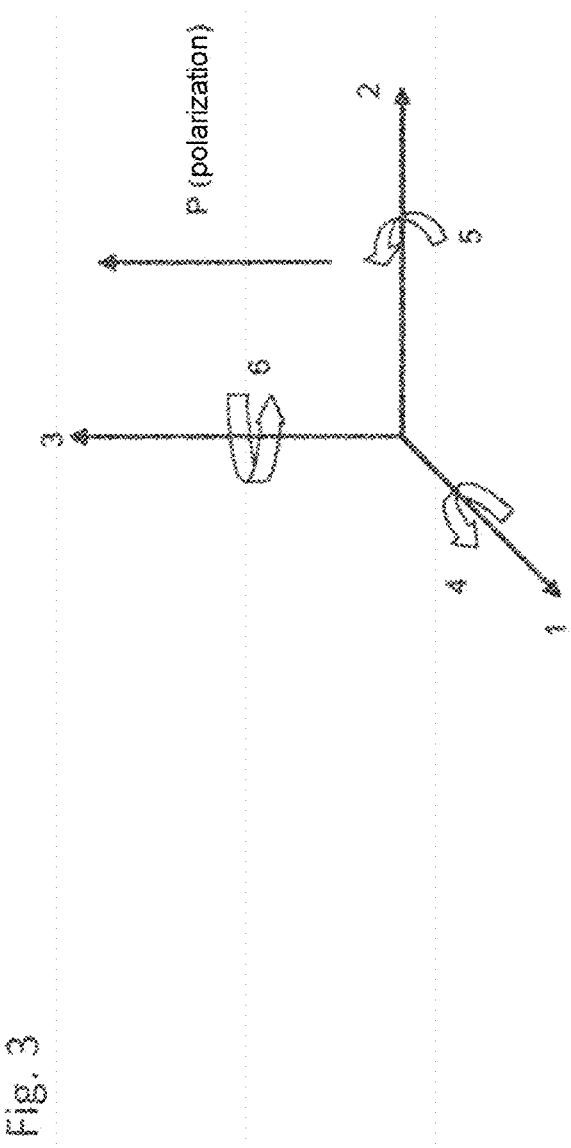
FIG. 3 is a representation of the system of orthogonal axes for the polarization, P, and the stress.

With reference to FIGS. 1 and 2, the invention relates to a tyre 1.

The tyre 1 comprises a crown 2 reinforced by a crown reinforcement or belt 6, two sidewalls 3 and two beads 4, each of these beads 4 being reinforced with a bead wire 5. The crown 2 is surmounted by a tread, not represented in this diagrammatic figure. A carcass reinforcement 7 is wound around the two bead wires 5 in each bead 4, the turn-up 8 of this reinforcement 7 being, for example, positioned towards the outside of the tyre 1, which is represented here fitted onto its wheel rim 9. The carcass reinforcement 7 is, in a way known per se, formed of at least one ply reinforced by "radial" cords, that is to say that these cords are positioned virtually parallel to one another and extend from one bead to the other so as to form an angle of between 80° and 90° with the median circumferential plane (plane perpendicular to the axis of rotation of the tyre which is located midway between the two beads 4 and passes through the middle of the crown reinforcement 6). The crown 2 and the sidewalls 3 define an internal cavity 10, facing a wheel rim when the tyre 1 is fitted in the form of a wheel. This cavity is intended to be inflated with air. It should be noted that this cavity defines an internal wall of the tyre 1, as opposed to an external wall intended to be, as regards the crown 2, in contact with the road.

A reference frame for the tyre 1 is defined comprising an axis of revolution X (corresponding to an axis of revolution of the tyre 1) which is arbitrarily oriented (assuming that the tyre 1 is symmetrical along said axis of revolution X), a radial axis Z orthogonal to the longitudinal axis X defining a radial direction oriented from the centre towards the periphery of the tyre 1, and an azimuthal axis Y (i.e., tangential, that is to say orthogonal, to both the radial axis Z and the longitudinal axis X) arbitrarily oriented along the direction of rolling of the tyre 1. Thus, in traversing the tyre 1 along the said radial direction, the internal wall, the constituent elements of the tyre 1, then the external wall, are successively encountered.

As represented in FIGS. 1 and 2, the tyre 1 advantageously comprises at least one insert 11, 12, and advantageously a plurality of inserts 11 and 12, each insert 11, 12 comprising the device according to the invention.

According to one embodiment, not represented in the figures, each insert 11, 12 extends along one of the sidewalls 3 or the crown 2 or along one sidewall 3 as far as the other sidewall 3 while passing through the crown 2, i.e. the inserts 11, 12 can be merged and extend over an entire region which can be as extensive as the total surface area of the crown and/or of the sidewalls.

According to another embodiment, each insert 11, 12 extends in a limited way along one of the sidewalls 3 or the crown 2, i.e. the inserts 11, 12 are localized, so that each insert 11, 12 extends over a specific region which is more restricted than the total surface area of the crown and/or of the sidewalls. In other words, the insert 11, 12 is localized at a predetermined position (along the crown 2 or the sidewall 3). This technical arrangement makes it possible to detect the location of an impact.

According to a first arrangement of this other embodiment, presented here, the tyre 1 comprises a series of first inserts 11 extending along the crown 2. The first inserts 11 are preferentially distributed according to an interval along the crown 2. The said interval is preferentially chosen with a length such that, between two successive first inserts 11, there is a zone of the crown 2 devoid of insert 11. The first inserts 11 are each positioned in an azimuthal plane perpendicular to the radial axis Z and coinciding with the longitudinal axis X and the azimuthal axis Y. The first inserts 11 are aimed at detecting the wear of the crown 2 and above all at detecting a radial impact on the tyre 1, for example when rolling over a pothole. Because of the plurality of first inserts, it is possible to easily find which zone of the crown 2 has been impacted, and to ensure that the tyre 1 does not exhibit damage there.

According to another arrangement of this other embodiment, which is not represented, the tyre 1 can comprise a single first insert 11, which makes it possible, in addition to measuring the wear of the tyre 1, to detect each revolution of the tyre (in fact, at each force detection, it is that the zone of the summit 2 facing the said single first insert 11 is in contact with the ground).

According to an alternative form of the first arrangement of this other embodiment, which is presented here, the tyre 1 additionally comprises a series of second inserts 12 extending along one or both sidewalls 3. In the event of a plurality of second inserts 12, the latter are each arranged in different angular sectors of the sidewall 3, and preferably are distributed according to an interval along each sidewall 3. Similarly to what is proposed for the first inserts 11, the said interval is preferentially chosen with a length such that, between two successive second inserts 12, there is a zone of the sidewall 3 devoid of insert 12. The second inserts 12 are each positioned substantially in a median plane perpendicular to the longitudinal axis X and coinciding with the radial axis Z and the azimuthal axis Y, even if it will be understood that, due to the convex nature of the tyre 1 when it is inflated, the orientation of the second inserts 12 may slightly deviate from the median plane.

The second inserts 12 make it possible to detect a side impact on the tyre 1, for example the striking of a pavement. Due to the arrangement in different angular sectors of the sidewall 3, it is possible to easily find which angular sector has been impacted, and to ensure that the tyre 1 does not exhibit damage there.

In all these embodiments, it will be understood that the terms "first" and "second" designating the inserts 11 or 12 relate only to their position and that in practice the first and second inserts 11, 12 are preferentially structurally identical. Furthermore, the present invention can comprise first inserts 11 and/or second inserts 12, the invention not being limited to any configuration.

According to a specific arrangement, the inserts 11 and/or 12 can be adhesively bonded in the cavity on the internal wall, respectively against the crown 2 and/or the sidewalls 3.

According to another specific arrangement, the inserts 11 and/or 12 can be embedded in the body of a material forming the crown 2 and/or the sidewalls 3.

According to another specific arrangement, the tyre 1 can successively comprise, along the radial direction, an inner layer and an outer layer. The outer layer can exhibit, at the crown 2, a tread intended to be in contact with the roadway and the inner layer being positioned on the underside of the outer layer. The inserts 11 and/or 12 can be positioned in the inner layer and/or in an interface region of the inner layer and of the outer layer.

According to another specific arrangement, the inserts 11 and/or 12 can be adhesively bonded to the carcass reinforcement 7.

It will be understood that the present invention is not limited to one of these specific arrangements, and that it is possible to combine them, for example by placing the first insert(s) 11 in the body of the material forming the crown 2, while adhesively bonding the second insert(s) 12 to the internal wall of a sidewall 3.

In the embodiment where the insert 11, 12 comprising the device is adhered to a cured or crosslinked tyre, the fixing can be carried out by conventional means known to a person skilled in the art, such as the scraping off of the dusting agent, the use of cold crosslinking or also fusion. The fixing can be carried out by adhesive bonding with an adhesive.

In particular, the insert, and thus the device according to the invention, can be adhered to the tyre via an adhesive strip.

The adhesive strip used as fixing zone on the member or as adhesive part on the tyre can be any type of known adhesive strip, sometimes called "scotch tape" or also PSA (Pressure Sensitive Adhesive).

As known to a person skilled in the art of adhesives, the name "Pressure Sensitive Adhesive" is used to denote materials which are intrinsically tacky or which have been made tacky by the addition of tackifying resins. Several methods make it possible to identify a PSA, in particular the following three:
  a PSA may be described by the Dahlquist criteria from the mechanical and viscoelastic viewpoint,
  a PSA is a material which permanently and aggressively has tack at ambient temperature and adheres strongly to various surfaces by simple contact without the need for a pressure greater than that applicable by hand,
  a PSA is a material, the storage modulus of which is between 0.02 MPa and 0.04 MPa at a frequency of 0.1 rad/s (0.017 Hz) and 0.2 MPa to 0.8 MPa at a frequency of 100 rad/s (17 Hz).

Preferentially for the invention, use is made, as adhesive strip, of an "acrylic" PSA, known to a person skilled in the art ("Technology of Pressure Sensitive Adhesives and Products" by I. Benedek and M. F. Feldstein, Chapter 5, "Acrylic adhesives" by P. B. Foreman), comprising 50% to 100% by weight of "primary" monomers. These monomers are acrylic acid esters obtained with primary or secondary alcohols, the alkyl parts of which are $C_4$-$C_{20}$ alkyls, and preferably these monomers are selected from the group consisting of 2-ethylhexyl acrylate, isooctyl acrylate, n-butyl acrylate and their mixtures. These primary monomers exhibit a low Tg, preferably of less than 0° C., which confers the weak and tacky nature of the adhesive strip. Optionally, the acrylic composition comprises from 0% to 35% by weight of "secondary" monomers, with a Tg of greater than 0° C., which are known to a person skilled in the art and preferentially selected from the group consisting of methyl acrylate, methyl methacrylate, vinyl acetate, styrene and their mixtures. More preferentially, methyl acrylate is used. These secondary monomers make it possible to improve the cohesion of the adhesive mass. They have the effect of increasing the modulus and the Tg. Optionally, the acrylic composition comprises from 0% to 15% of polar and functional monomers, which can be of any type other than the primary and secondary monomers described above. Preferentially, these monomers are selected from the group consisting of acrylic acid, methacrylic acid, hydroxyethyl acrylate, acrylamides (such as butylacrylamide or octylacrylamide), methacrylamides, N-vinylpyrrolidone, N-vinylcaprolactam and their mixtures. More preferentially, acrylic acid is used. These monomers can increase the adhesion by setting up interactions of Van der Waals type on polar supports. Moreover, they can also contribute to the cohesion of the body by dipole-dipole interactions or hydrogen bridges.

The adhesive strip is preferably foamed, that is to say obtained by the dispersion of a gas in a condensed phase, whether the gas phase is supplied directly or via solids (compounds which generate gas, expandable polymer beads, glass microbeads). It may, for example, concern a crosslinked acrylic foam taken between two crosslinked acrylic adhesive bodies, the foam effect being obtained by the use of glass microbeads. The main methods of obtaining "foamed" PSAs are thus, for example, the direct injection of gas, the addition of expandable polymer microspheres, the addition of glass microbeads (porous or not), the addition of chemical foaming agents or solvent evaporation.

PSAs known under the designation "VHB" (very high bond) are provided by 3M, can conform to non-flat surfaces and can be used for the requirements of the invention, such as, for example, "VHB 4955". High-performance "VHB" adhesive strips are assembly strips formed of a homogeneous mass of foamed acrylic adhesive. Traditionally used in construction, they offer high adhesiveness on a variety of substrates and provide thicknesses ranging up to 3 mm. As the stress is distributed throughout the entire thickness, these products absorb a maximum of energy during impacts, vibrations or mechanical stresses. They are indicated for applications exhibiting flatness or roughness defects as well as for applications externally and requiring leaktightness.

EXAMPLES

Rubber Composition of the Layer P:
The rubber composition is based on:
100 phr of diene elastomer
1 phr of dicumyl peroxide (bis(1-phenyl-1-methylethyl) peroxide)
from 0% to 50% by volume, with respect to the total volume of the rubber composition, of piezoelectric inorganic fillers.

Piezoelectric inorganic fillers: $BaTiO_3$: average diameter 500 nm or 700 nm, density 5.85 g/cm$^3$—Inframat Advanced Materials The diene elastomer is a non-functionalized styrene/butadiene copolymer, non-functionalized SBR (styrene/butadiene rubber), having 26.5% by weight of styrene unit, with respect to the total weight of the copolymer, and 24 mol % of 1,2-butadiene unit, with respect to the butadiene part, and having a glass transition temperature, Tg, of −48° C.

The glass transition temperature Tg is measured in a known way by DSC (Differential Scanning calorimetry) according to Standard ASTM D3418 of 1999.

The non-functionalized SBS has a number-average molecular weight, Mn, ranging from 100 000 to 150 000 g/mol.

The microstructure of the SBR (relative distribution of 1,2-vinyl, trans-1,4- and cis-1,4-butadiene units) and the quantitative determination of the content by weight of styrene in the SBR are determined by near-infrared (NIR) spectroscopy. The principle of the method is based on the Beer-Lambert law generalized for a multicomponent system. As the method is indirect, it involves a multivariate calibration [Vilmin, F., Dussap, C. and Coste, N., Applied Spectroscopy, 2006, 60, 619-29] carried out using standard elastomers having a composition determined by $^{13}C$ NMR. The styrene content and the microstructure are then calculated from the NIR spectrum of an elastomer film approximately 730 μm in thickness. The spectrum is acquired in transmission mode between 4000 and 6200 cm$^{-1}$ with a resolution of 2 cm$^{-1}$ using a Bruker Tensor 37 Fourier-transform near-infrared spectrometer equipped with an InGaAs detector cooled by the Peltier effect.

Rubber Composition of the Layer E:
The two layers E have the same composition.
The rubber composition is based on:
100 phr of diene elastomer
1 phr of dicumyl peroxide (bis(1-phenyl-1-methylethyl) peroxide)
25% by volume, with respect to the total volume of the rubber composition, of conductive fillers.

Conductive fillers: Timcal carbon black "Ensaco 350G", with a specific surface (BET, measured according to Standard ASTM D3037) of 770 m$^2$/g. The diene elastomer is the same styrene/butadiene copolymer, SBR, as that used in the rubber composition of the layer P.

Preparation Process:

For the rubber compositions of the layers E and P, the following general protocol is followed: The compositions are manufactured in appropriate mixers, using two successive phases of preparation which are well known to a person skilled in the art: a first phase of thermomechanical working or kneading (sometimes referred to as "non-productive" phase) at high temperature, up to a maximum temperature (denoted Tmax) of between 80° C. and 190° C., preferably between 80° C. and 150° C., followed by a second phase of mechanical working (sometimes referred to as "productive" phase) at lower temperature, typically below 80° C., for example between 60° C. and 80° C., during which finishing phase the crosslinking system is incorporated; such phases have been described, for example, in the documents EP 501 227, EP 735 088, WO00/05300, WO00/05301 or WO02/083782.

By way of example, the first (non-productive) phase is carried out in a single thermomechanical stage during which the diene elastomer and the fillers, in one or more steps, with the exception of the crosslinking system, are introduced into an appropriate mixer, such as an ordinary internal mixer. The total duration of the kneading, in this non-productive phase, is preferably between 2 and 10 minutes.

After cooling the mixture thus obtained, the crosslinking system is then incorporated at low temperature, generally in an external mixer, such as an open mill; everything is then mixed (productive phase) for a few minutes, for example between 5 and 15 minutes.

The final composition thus obtained is subsequently calendered, for example in the form of a plaque.

The plaque forming the layer P is inserted between two plaques forming the layers E.

A curing mould is used for the production of the device. The following are successively arranged in this mould:
the layer E in the form of a plaque with dimensions of 100 mm×100 mm×1 mm (l×w×t),
the layer P in the form of a plaque with dimensions of 100 mm×100 mm×2 mm (l×w×t),
the layer E in the form of a plaque with dimensions of 100 mm×100 mm×1 mm (l×w×t), Subsequently, this mould is placed in a plate press where the materials are cured at 170° C. under 12 tonnes of pressure for 20 minutes.

On conclusion of this operation, it is entirely possible to cut out the laminates with a hollow punch or any other cutting means in order to produce a piezoelectric composite with its two electrodes having the shape and the size desired.

Test Specimens for the Effect of the Content of Filler and the Characterizations in Deformation and in Cycling:

A parallelepiped of Length×Width×Thickness: 3×1.5×4 (mm), is cut out from the device obtained above.

Polarization Conditions:
Time: 1 h
Temperature: 100° C.
Electric field: 4.5 kV/mm Measurement of the Amount of Electric Charge Emitted:
Metravib DMA with specific extension jaws which make it possible to capture the charges collected on the electrodes of the composites>Charge amplifier>Oscilloscope
Stress mode: variable extension from 0.01% to 2% depending on the matrix Measurements in Deformation and Cycling:
Instron-type tensile testing device with specific extension jaws In Examples 1 to 3 which follow, the device comprising a layer P inserted between two layers E was tested and characterized. In Example 4, the layer P alone was tested and characterized.

Example 1. Effect of the Content of Filler

In the device tested, the layer P comprises 0%, 33% or 50% by volume, with respect to the total volume of the rubber composition, of piezoelectric inorganic fillers with a diameter of 500 nm. Each layer E is identical and as described above.

500 nm Particles—Dynamic Stress: 2% Deformation at 1 Hz

TABLE 1

|  | 1 | 2 | 3 |
|---|---|---|---|
| Rubber composition forming the layer P | | | |
| Elastomer (phr) | 100 | 100 | 100 |
| BaTiO$_3$ (phr) | 0 | 194.7 | 295 |
| Peroxide (phr) | 1 | 1 | 1 |
| Vol. fraction BaTiO$_3$ (%vol) | 0 | 33 | 50 |
| Restored content of charges | | | |
| d31 (pC/N) | 0 | 4.1 | 17.3 |

Conclusion: The content of ferroelectric ceramic particles has a direct impact on the restored content of electric charge for one and the same deformation. The piezoelectric behaviour of the device is observed from 33% by volume of piezoelectric fillers. The various particle diameters make it possible to obtain composites having a piezoelectric activity.

Example 2. Characterization in Deformation

In the device tested, the layer P comprises 33% by volume, with respect to the total volume of the rubber composition, of piezoelectric inorganic fillers with a diameter of 500 nm. Each layer E is identical and as described above.

The aim of this characterization is to observe the change in the electric charge delivered by the material as a function of the force applied in traction over a chosen number of cycles. As these measurements are made over cycles, it was necessary to determine a constant frequency for carrying out these cycles, so that the variation in the frequency does not influence the value of the charge delivered. Thus, as the testing device has a maximum operating speed (of approximately 1 m/min), the frequency was chosen so that the device goes at its maximum speed when measuring for the maximum deformation (initially 50%). The measurement conditions were thus as follows:

Temperature: ~25° C.
Pressure: ~1 atm
Frequency: 0.3 Hz
Number of cycles: 30

The measurements were thus carried out for different deformation values and are reported in the following table:

| deformation (%) | d$_{31}$ average (pC/N) |
|---|---|
| 0.97 | 4.06 |
| 1.95 | 4.07 |
| 2.43 | 4.11 |
| 2.99 | 4.19 |
| 3.5 | 4.22 |
| 4.48 | 4.23 |
| 4.98 | 4.27 |
| 5.48 | 4.3 |
| 7.47 | 4.3 |
| 9.9 | 4.34 |
| 15 | 4.25 |
| 19.88 | 4.15 |
| 24.93 | 4.13 |
| 29.94 | 4.1 |

Thus, on analysing the results, it can be concluded that the piezoelectric coefficient does not vary for deformations of between 0% and 35%. However, for a deformation of 50%, a slight drop in the coefficient can be noticed, but it is not possible to determine if this is an intrinsic property of the material or if it is due to the electromechanical losses which become increasingly significant with the deformation.

Example 3. Characterization in Cycling

In the device tested, the layer P comprises 33% by volume, with respect to the total volume of the rubber composition, of piezoelectric inorganic fillers with a diameter of 500 nm. Each layer E is identical and as described above.

In a first step, the tests were carried out over the course of a weekend with the following conditions:

Frequency: 1 Hz
Deformation: 1.25%
Pressure: ~1 atm
Temperature: ~25° C.

The measurements were thus carried out under these constant conditions without interruption for several hours (40 000 cycles) and are reported in the following table:

TABLE 3

| No. of cycles | d$_{31}$ average (pC/N) |
|---|---|
| 1 | 4.1 |
| 10 | 4.12 |
| 100 | 4.27 |
| 1000 | 4.3 |
| 2000 | 4.22 |
| 3000 | 4.1 |
| 4000 | 4.19 |
| 5000 | 4.15 |
| 10 000 | 4.25 |

TABLE 3-continued

| No. of cycles | $d_{31}$ average (pC/N) |
|---|---|
| 15 000 | 4.13 |
| 20 000 | 4.08 |
| 25 000 | 4.23 |
| 30 000 | 4.08 |
| 40 000 | 4.13 |

Thus, it is clearly apparent that, at ambient temperature, cycling has no effect on the endurance at the piezoelectric level of the material. In addition, measurements were also carried out at 40° C., 60° C., 80° C. and 100° C. And, for these characterizations, the material does not undergo any notable variation in its $d_{31}$ coefficient.

Example 4: Mechanical Properties of the Layer P

In this example, the mechanical properties of the layer P alone are tested. The layer P comprises 33% by volume, with respect to the total volume of the rubber composition, of piezoelectric inorganic fillers with a diameter of 500 nm.

Rheogram: Measurement of the S'

The method of measurement of S' uses an RPA 2000LV rheology device (oscillating disc rheometer) equipped with the standard 200 in.lbs (22.6 Nm) viscosity sensor. The RPA device makes it possible to stress in torsion a sample of material enclosed in a chamber having biconical walls.

In order to carry out the measurement, a sample of material having a diameter of approximately 30 mm and a weight of approximately 5 g is deposited in the chamber of the RPA (A total volume of 8 cm³ is regarded as optimal; the amount is sufficient when a small amount of sample escapes from each side of the chamber and is visible at the end of the test). Preferably, the material is cut out beforehand from a sheet of this material. In the case where this sheet of material is insufficiently thick, it is possible to stack the sections of this sheet of material.

A curing operation is carried out by applying, to the sample enclosed in the chamber, a temperature of 170° C. for 40 min with a shearing of 2.78% (i.e., an angle of 0.19°). The state of curing of the mixture, as given by the modulus S' as a function of the time, is measured at each instant. These first stages are in accordance with the conditions provided in Standard ISO 3417 of February 2009, which gives the parameters for preparation and for tests for analysing a crosslinking time of a sample in the rheometer.

The stages of forming and of crosslinking the sample and of measurement of S' are carried out without intervention, by programming the RPA device.

The measurements are carried out at 170° C. with an oscillating disc rheometer, according to Standard DIN 53529—Part 3 (June 1983). The change in the rheometric torque as a function of the time describes the change in the stiffening of the composition as a result of the crosslinking reaction. The measurements are processed according to Standard DIN 53529—Part 2 (March 1983). Ti is the induction period, that is to say the time necessary for the start of the crosslinking reaction, Ta (for example T95) is the time necessary to achieve a conversion of α %, that is to say α % (for example 95%) of the difference between the minimum and maximum torques.

The results are given in the following table:

TABLE 4

| time (min) | S' (dN · m) |
|---|---|
| 1 | 8 |
| 2 | 12 |
| 3 | 16 |
| 4 | 18 |
| 5 | 20 |
| 10 | 24 |
| 15 | 26 |
| 20 | 26 |

This measurement makes it possible to determine the optimum curing time for material forming the layer P. Given that this time is 15 minutes, it is entirely compatible with tyre curing.

Dynamic Properties:

The dynamic properties G* and tan(δ)max are measured on a viscosity analyser (Metravib VA4000) according to Standard ASTM D 5992-96. The response of a sample of crosslinked composition (cylindrical test specimen with a thickness of 4 mm and a cross section of 400 mm²), subjected to a simple alternating sinusoidal shear stress, at a frequency of 10 Hz, at 60° C., according to Standard ASTM D 1349-99, is recorded. A peak-to-peak strain amplitude sweep is carried out from 0.1% to 100% (outward cycle) and then from 100% to 1% (return cycle). The results made use of are the complex dynamic shear modulus (G*) on the return cycle.

The dynamic properties are measured on a viscosity analyser (Metravib VA4000) according to Standard ASTM D 5992-96. The response of a sample of crosslinked composition (cylindrical test specimen with a height of 4 mm and a cross section of 400 mm²), subjected to a simple alternating sinusoidal shear stress, at a frequency of 10 Hz, at 60° C., is recorded. A strain amplitude sweep is carried out from 0.1% to 100% (outward cycle) and then from 100% to 0.1% (return cycle). The results made use of are the complex dynamic shear modulus G*.

The results are given in the following table:

TABLE 5

| deformation (%) | G* (MPa) |
|---|---|
| 0.1 | 4.5 |
| 0.2 | 4.5 |
| 0.3 | 4.5 |
| 0.4 | 4.5 |
| 0.5 | 4.3 |
| 1 | 4 |
| 3 | 3.9 |
| 5 | 3.5 |
| 10 | 3.2 |
| 11 | 3 |
| 50 | 2.8 |
| 100 | 2.5 |

By virtue of this measurement, it is demonstrated that the piezoelectric material forming the layer P is deformable up to 100% deformation, thus making it possible to envisage its incorporation in a tyre.

The invention claimed is:

1. A piezoelectric device comprising at least one piezoelectric composite layer P inserted between two conductive composite layers E, each layer E forming an electrode,
wherein the layer P is a rubber composition based on:
more than 50 parts by weight, per hundred parts by weight of elastomer, phr, of diene elastomer;
a crosslinking system; and
at least 5% by volume, with respect to a total volume of the rubber composition, of piezoelectric inorganic fillers;
wherein each layer E is a rubber composition based on:
at least 50 phr of diene elastomer;
a crosslinking system; and
conductive fillers, and
wherein the diene elastomer of the layer P is co-crosslinked with the diene elastomer of each layer E, and
wherein a piezoelectric coefficient of the layer P does not significantly vary for deformations of the piezoelectric device between 0% and 35%.

2. The piezoelectric device according to claim 1, wherein, in the layer P, the content of piezoelectric inorganic fillers varies from 5% to 80% by volume, with respect to the total volume of rubber composition.

3. The piezoelectric device according to claim 1, wherein, in the layer P, a size of the piezoelectric inorganic fillers varies from 50 nm to 500 μm.

4. The piezoelectric device according to claim 1, wherein the piezoelectric inorganic fillers are piezoelectric ceramics.

5. The piezoelectric device according to claim 1, wherein the piezoelectric inorganic fillers are selected from the group consisting of barium titanate, lead titanate, lead zirconate titanate, lead niobate, lithium niobate and potassium niobate.

6. The piezoelectric device according to claim 1, wherein the rubber composition of the layer P comprises from 75 phr to 100 phr of diene elastomer.

7. The piezoelectric device according to claim 1, wherein the crosslinking system of the layer P, the crosslinking system of one or of each layer E, or the crosslinking system of the layer P and the crosslinking system of one or of each layer E is selected from the group consisting of peroxides and mixtures thereof.

8. The piezoelectric device according to claim 7, wherein peroxides are organic peroxides selected from the group consisting of dialkyl peroxides, monoperoxycarbonates, diacyl peroxides, peroxyketals, peroxyesters and mixtures thereof.

9. The piezoelectric device according to claim 1, wherein, in one or in each layer E, a content of conductive fillers varies from 10% to 40% by volume, with respect to the total volume of rubber composition.

10. The piezoelectric device according to claim 1, wherein, in one or each layer E, the conductive fillers are graphitized or partially graphitized carbon black.

11. A process for the preparation of a piezoelectric device according to claim 1, the process comprising:
polarizing at a polarization temperature lower by at least 5° C. than a lowest Curie temperature, Tc, of the piezoelectric inorganic fillers.

12. A process for the preparation of a piezoelectric device according to claim 1, the process comprising:
(a1) placing at least one piezoelectric composite layer P between two identical or different conductive composite layers E, in order to obtain an assembly;
(a2) applying a pressure to the assembly obtained following stage (a1); and
(a3) crosslinking the assembly in order to obtain the piezoelectric device.

13. The process according to claim 12, further comprising:
(a4) polarizing the piezoelectric device obtained following stage (a3) at a polarization temperature lower by at least 5° C. than a lowest Curie temperature, Tc, of the piezoelectric inorganic fillers.

14. The process according to claim 12, wherein the at least one piezoelectric composite layer P is prepared by the following steps:
(b1) incorporating a piezoelectric inorganic filler in a diene elastomer, in a mixer, with thermomechanical kneading, until a maximum temperature of between 80° C. and 190° C. is reached;
(b2) cooling the mixture from step (b1) to a temperature of less than 80° C.;
(b3) subsequently incorporating a crosslinking system;
(b4) kneading to a maximum temperature of less than 80° C.; and
(b5) calendering or extruding a rubber composition thus obtained to form a strip.

15. The process according to claim 12, wherein each conductive composite layer E is prepared by the following steps:
(c1) incorporating a conductive filler in a diene elastomer, in a mixer, with thermomechanical kneading, until a maximum temperature of between 110° C. and 190° C. is reached;
(c2) cooling the mixture from step (c1) to a temperature of less than 100° C.;
(c3) subsequently incorporating a crosslinking system;
(c4) kneading to a maximum temperature of less than 110° C.; and
(c5) calendering or extruding a rubber composition thus obtained to form a strip.

16. A tire comprising a piezoelectric device according to claim 1.

17. The tire according to claim 16, further comprising a sensor.

* * * * *